United States Patent
Vasa et al.

(10) Patent No.: US 10,904,998 B2
(45) Date of Patent: Jan. 26, 2021

(54) SYSTEM AND METHOD FOR VIA OPTIMIZATION IN A PRINTED CIRCUIT BOARD

(71) Applicant: DELL PRODUCTS, LP, Round Rock, TX (US)

(72) Inventors: Mallikarjun Vasa, Secunderabad (IN); Bhyrav M. Mutnury, Austin, TX (US)

(73) Assignee: Dell Products, L.P., Round Rock, TX (US)

(*) Notice: Subject to any disclaimer, the term of this patent is extended or adjusted under 35 U.S.C. 154(b) by 0 days.

(21) Appl. No.: 16/400,917

(22) Filed: May 1, 2019

(65) Prior Publication Data
US 2020/0352025 A1 Nov. 5, 2020

(51) Int. Cl.
H05K 7/00 (2006.01)
H05K 1/02 (2006.01)

(52) U.S. Cl.
CPC .......... *H05K 1/0251* (2013.01); *H05K 1/0222* (2013.01); *H05K 1/0243* (2013.01)

(58) Field of Classification Search
USPC ........................................................ 361/760
See application file for complete search history.

(56) References Cited

U.S. PATENT DOCUMENTS

| | | |
|---|---|---|
| 6,452,461 B1 | 9/2002 | Su et al. |
| 8,573,089 B2 | 11/2013 | Nishino et al. |
| 9,148,198 B1 | 9/2015 | Zhang et al. |
| 10,187,094 B1 * | 1/2019 | Nedovic .................. H04B 1/16 |
| 10,194,524 B1 * | 1/2019 | Park ..................... H05K 1/0218 |
| 2005/0089126 A1 | 4/2005 | Zerbe et al. |
| 2008/0269003 A1 | 10/2008 | Bauknecht et al. |
| 2013/0220690 A1 * | 8/2013 | Chang .................. H05K 1/0219 174/262 |
| 2015/0085914 A1 | 3/2015 | Kizer et al. |
| 2015/0256363 A1 | 9/2015 | Shvydun et al. |
| 2016/0118121 A1 | 4/2016 | Kelly et al. |
| 2016/0149730 A1 | 5/2016 | Navid |
| 2018/0233853 A1 | 8/2018 | Janowiak et al. |

* cited by examiner

*Primary Examiner* — Andargie M Aychillhum
(74) *Attorney, Agent, or Firm* — Larson Newman, LLP

(57) ABSTRACT

A signal trace on a printed circuit board (PCB) includes a first trace segment on a first layer of the PCB, the first trace segment having a first end coupled to a transmitter, having a second end, and having a first characteristic impedance that is matched to the transmitter. The signal trace further includes a signal via passing from the first layer of the PCB to a second layer of the PCB, the signal via having a first contact connected to the second end of the first trace segment, having a second contact on the second layer, and having a second characteristic impedance different from the first characteristic impedance. The second characteristic impedance is determined based upon a first distance between the transmitter and the first via.

20 Claims, 5 Drawing Sheets

SYSTEM AND METHOD FOR VIA OPTIMIZATION IN A PRINTED CIRCUIT BOARD

FIELD OF THE DISCLOSURE

This disclosure generally relates to information handling systems, and more particularly relates to optimizing via layout in a printed circuit board.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A signal trace on a printed circuit board (PCB) may include a first trace segment on a first layer of the PCB, the first trace segment having a first end coupled to a transmitter, having a second end, and having a first characteristic impedance that is matched to the transmitter. The signal trace may further include a signal via passing from the first layer of the PCB to a second layer of the PCB, the signal via having a first contact connected to the second end of the first trace segment, having a second contact on the second layer, and having a second characteristic impedance different from the first characteristic impedance. The second characteristic impedance may be determined based upon a first distance between the transmitter and the first via.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
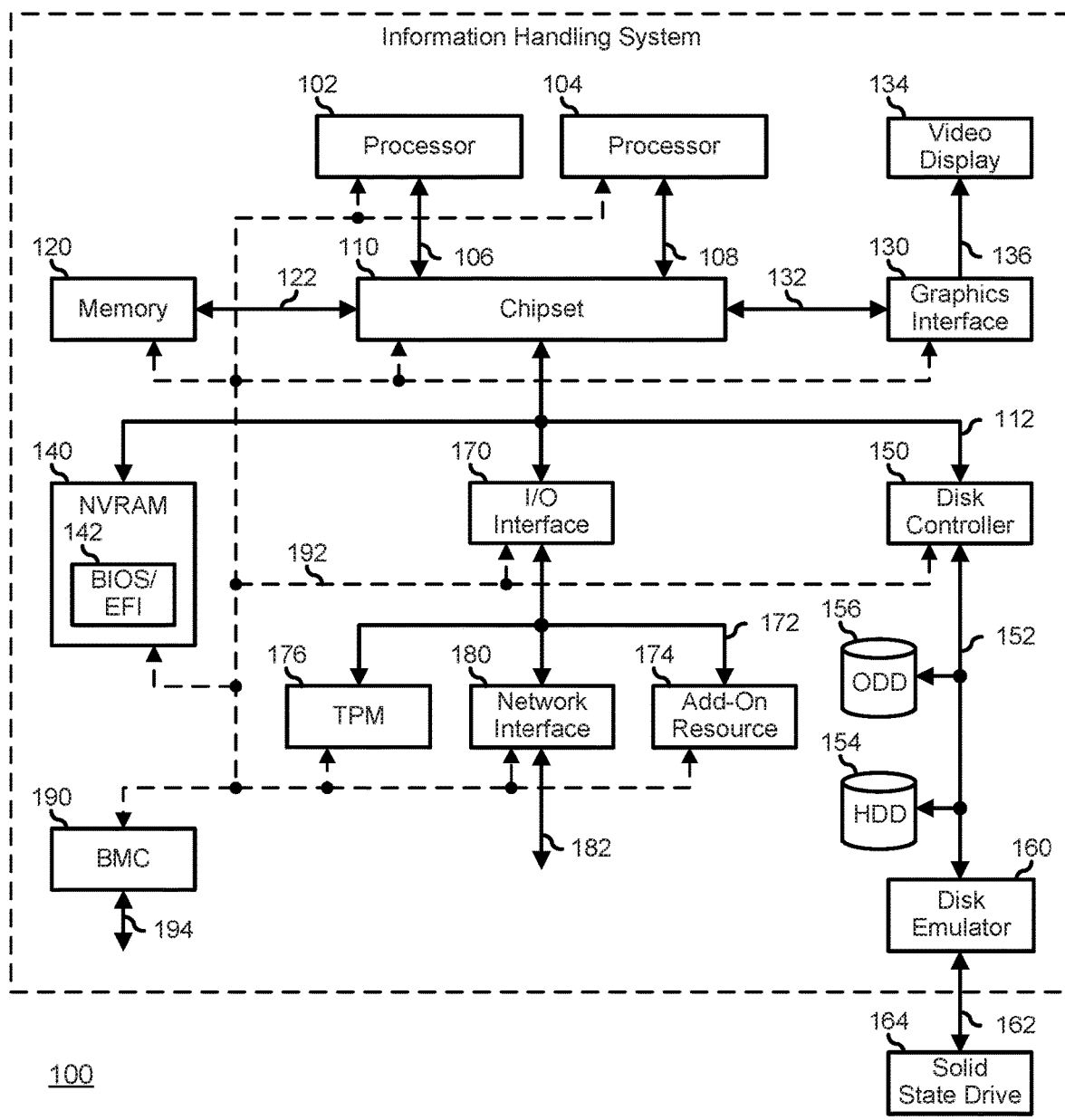
FIG. 1 is a block diagram of an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid state drive (SSD) 164, an input/output (I/O) interface 170 connected to an add-on resource 174 and a trusted platform module (TPM 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manages the data flows between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104. Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132, and provides a video display output 136 to a video display 134. An example of a graphics interface 132 includes a Peripheral Component Interconnect-Express (PCIe) interface and graphics adapter 130 can include a four lane (x4) PCIe adapter, an eight lane (x8) PCIe adapter, a 16-lane (x16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface device 180 includes a network channel 182 that provides an interface to devices that are external to information handling system 100. In a particular embodiment, network channel 182 is of a different type than peripheral channel 172 and network interface 180 translates information from a format suitable to the peripheral channel to a format suitable to external devices. In a particular embodiment, network interface 180 includes a network interface card (NIC) or host bus adapter (HBA), and an example of network channel 182 includes an InfiniBand channel, a Fibre Channel, a Gigabit Ethernet channel, a proprietary channel architecture, or a combination thereof.

In another embodiment, network interface 180 includes a wireless communication interface, and network channel 182 includes a Wi-Fi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term baseboard management controller (BMC) is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers.

Capabilities and functions provided by BMC 180 can vary considerably based on the type of information handling system. BMC 190 can operate in accordance with an Intelligent Platform Management Interface (IPMI). Examples of BMC 190 include an Integrated Dell Remote Access Controller (iDRAC). Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code. BMC 190 operates to monitor and maintain system firmware, such as code stored in BIOS/EFI module 142, option ROMs for graphics interface 130, disk controller 150, add-on resource 174, network interface 180, or other elements of information handling system 100, as needed or desired.

In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image. BMC 190 utilizes various protocols and application programming interfaces (APIs) to direct and control the processes for monitoring and maintaining the system firmware. An example of a protocol or API for monitoring and maintaining the system firmware includes a graphical user interface (GUI) GUI associated with BMC 190, an interface defined by the Distributed Management Taskforce (DMTF) (such as a Web Services Management (WS-MAN) interface, a Management Component Transport Protocol (MCTP) or, a Redfish interface), various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100, or is integrated onto another element of the information handling system such as chipset 110, or another suitable element, as needed or desired. As such, BMC 190 can be part of an integrated circuit or a chip set within information handling system 100. An example of BMC 190 includes an integrated Dell remote access controller (iDRAC), or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Via structures play an important role in printed circuit board (PCB) design where circuit traces need to be transitioned from one layer in the PCB to another. In particular, vias are utilized where AC coupling capacitors are provided, where a ball-grid array (BGA) is mounted to the surface of the PCB, and in other locations on the PCB, as needed or desired. As the speed of signals increases, ground (GND) vias, that is, vias that are placed proximate to the signal vias, are utilized to ensure a good current return path for the signals. Further, where the signal speeds increase, for example to 25 gigabits per second (Gbps), 32 Gbps, or beyond, the location of the via structures needs to be optimized to achieve the best signal quality. Otherwise, subtle effects from via crosstalk and reflections get magnified into the high speeds signal traces.

Figure 2:
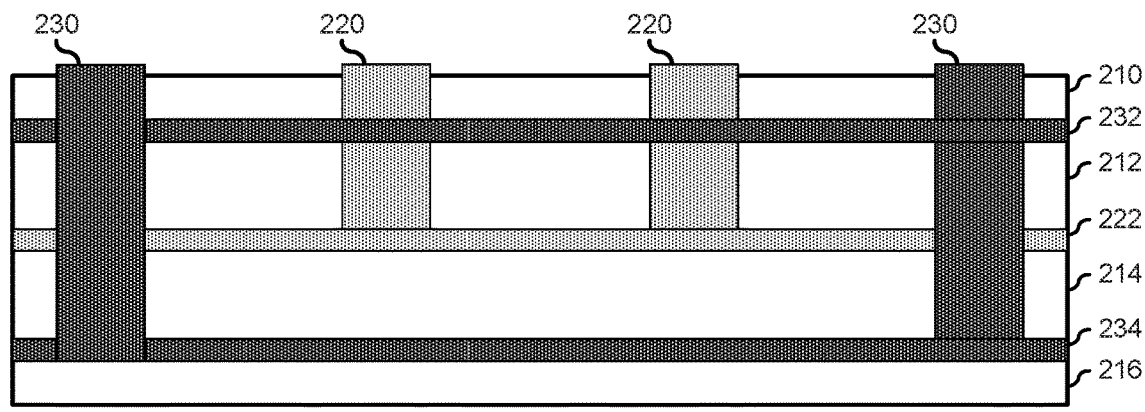
FIG. 2 is an edge view of a printed circuit board (PCB) according to an embodiment of the present disclosure.

FIG. 2 illustrates an edge view of a PCB 200. PCB 200 has insulating layers 210, 212, 214, and 216 and conducting layers 222, 232, and 234. PCB 200 is arranged such that insulating layer 210 is a top layer, conducting layer 232 is sandwiched between insulating layers 210 and 212, conducting layer 222 is sandwiched between insulating layers 212 and 214, and conducting layer 234 is sandwiched between insulating layers 214 and 216. Insulating layers 210, 212, 214, and 216 represent a bulk material of PCB 200, and may include a bulk material including a resin impregnated laminate material, such as a FR-X type material, a CEM-X type material, a G-10 type material, or another suitable bulk material, as needed or desired. Conducting layers 222, 322, and 324 represent thin layers of copper or another conducing material suitable for the and the provision of power to the circuits of PCB 200 and the transmission of the signals associated with the circuits of the PCB.

PCB 200 includes signal vias 220 and one or more ground vias 230. Signal vias 220 represent the conductors of a differential signal pair of a high-speed serial interface. As such, one of signal vias 220 represents a non-inverted leg of the differential signal pair and the other one of signal vias 220 represents an inverted leg of the differential signal pair. Signal vias 220 span from the top surface of insulating layer 210 to conductive layer 222, and are utilized to electrically connect signal traces formed on the top surface of the insulating layer to signal traces formed within the conductive layer. Ground vias 230 represent vias formed in PCB 200 that are position to provide a good current return path for the signals carried on signal vias 220, to shield against electromagnetic interference (EMI) effects, to provide immunity from crosstalk from other nearby signal traces on the PCB, and to otherwise improve the quality of the signals carried by the signal vias. As such, ground vias 230 are electrically connected to conducting layers 232 and 234 which are electrically connected to a circuit ground (GND) of PCB 200.

Vias 220 and 230 may be fabricated in PCB 200 as through-hole drilled vias (vias extending from a top surface of the PCB to a bottom surface of the PCB), blind vias (vias extending from a top or bottom surface of the PCB to only part way through the PCB), buried vias (vias that are completely within inner layers of the PCB and do not extend to either the top or bottom surface of the PCB), or as other types of layer spanning vias, as needed or desired. Further, vias 220 and 230 may be fabricated as copper plated vias, as copper filled vias, as copper plated and epoxy filled vias, or other types of conductor forming vias, as needed or desired. The details of PCB fabrication are known in the art and will not be further described herein except as needed to illustrate the present embodiments.

Figure 3:
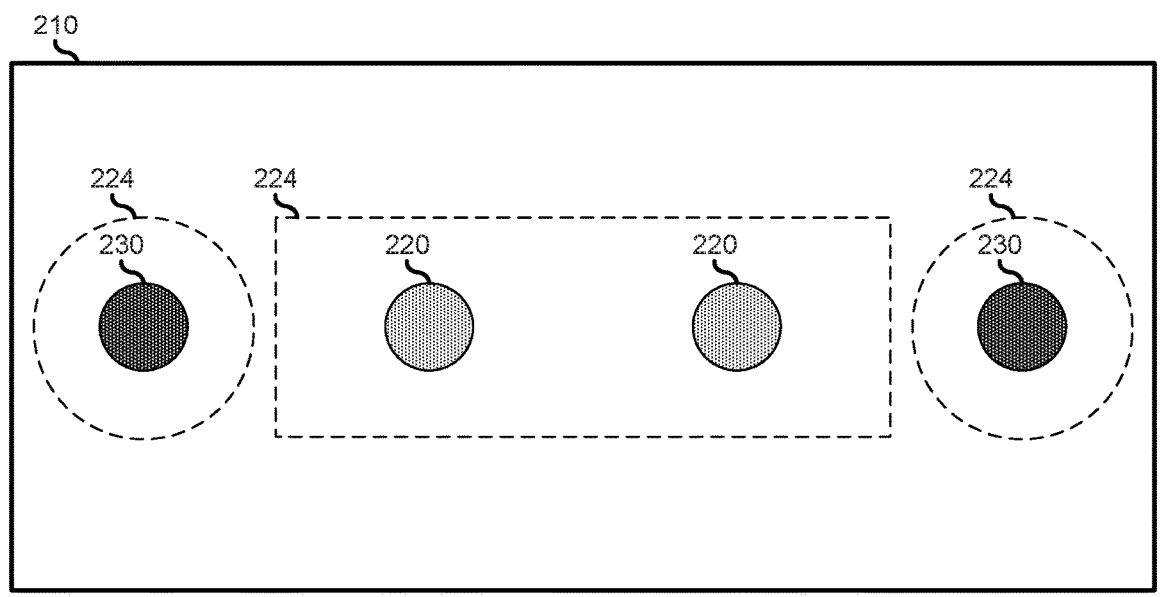
FIG. 3 is a top view of the PCB of FIG. 2.

FIG. 3 illustrates a top view of PCB 200 including top insulating layer 210, signal vias 220, ground vias 230, and an anti-pad area 224. Anti-pad area 224 is illustrated with a dashed line to represent that the anti-pad is an exclusion zone in the power and ground layers of PCB 200. That is, the power and ground conductor material in the power and ground layers are etched around signal vias 220 to keep the signals from shorting to the power and ground layers, and to provide improved signal quality.

It will be understood that a characteristic impedance of the signal traces of a differential signal pair of a high-speed serial interface will be effected by the design layout of the signal traces, the signal and ground vias, and the anti-pad areas associated with the signal vias. In particular, where vias are utilized, the via layout may be designed to meet a particular impedance, and that the characteristics of the vias may be different based upon the desired impedance. For example, the diameters of the signal and ground vias, the spacings between the signal and ground vias, the size of the signal via anti-pad and the ground via anti-pads, or other characteristics of the via design can be different for different desired impedances. The details of designing a via layout to provide a particular impedance are known in the art, and will not be further described herein except as needed to illustrate the present embodiments.

It will be further understood that as the signal speeds of high-speed serial interfaces increases, discontinuities in the channel can adversely affect signal quality. Signal vias represent a major source of discontinuities in the channel. Examples include ball-grid array (BGA) break out vias, AC coupling capacitor vias, connector vias, and transition vias. Up front via modeling and via design analysis can mitigate reflections in a channel layout to achieve the improved performance. The modeling and analysis can incorporate various parameters, such as via barrel size, via anti pad size, via pitch, via pad size, and dielectric constant. The modeling and analysis can further be aided through the use of time-domain reflectometry (TDR) measurements of test channels or the actual channels on a printed circuit board.

Figure 4:
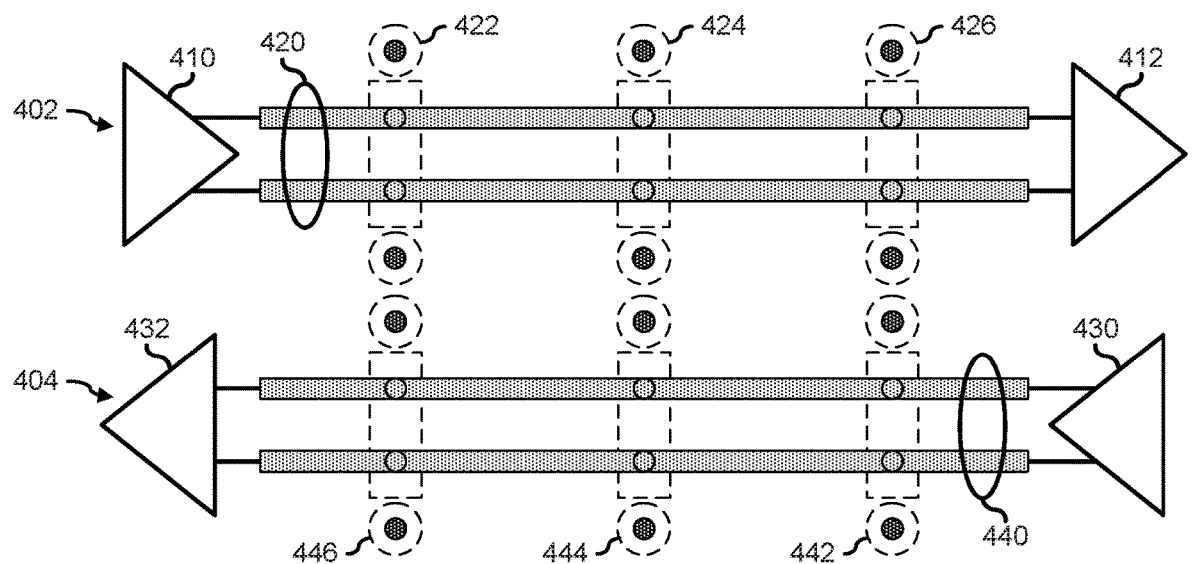
FIG. 4 is a diagram of a prior art high-speed serial interface.

FIG. 4 illustrates a high-speed serial interface 400 in accordance with the prior art. High-speed serial interface 400 includes a transmit channel 402 and a receive channel 404. Note that the terms "transmit" and "receive" are provided relative to a device located on the left-hand side of the figure as a matter or convention, but can equally be denoted relative to a device located on the right-hand side of the figure. Transmit channel 402 includes a transmitter 410 in a first device (not illustrated) and a receiver 412 in a second device (not illustrated). Transmitter 410 represents a differential signal transmitter that provides a balanced signal to a trace 420 to receiver 412. Trace 420 includes vias 422, 424, and 426. Receive channel 404 includes a transmitter 430 in the second device and a receiver 432 in the first device. Transmitter 430 represents a differential signal transmitter that provides a balanced signal to a trace 440 to receiver 432. Trace 440 includes vias 442, 444, and 446.

Transmitters 410 and 430 are typically configured to drive signals onto respective traces 420 and 440 at a common driving impedance. For example, a transmitter may be configured to drive signals onto a trace with a driving impedance of 70 ohms, 75 ohms, 80 ohms, 85 ohms, 90 ohms, 100 ohms, or another driving impedance, as needed or desired. Similarly, receivers 412 and 432 may be configured to receive signals from a trace with a receiving impedance that is the same as the driving impedance of the associated transmitter. Thus the traces between a transmitter and a receiver are typically designed to a characteristic impedance that matches the driving impedance and the receiving impedance. More particularly, vias 422, 424, 426, 442, 444, and 446 are typically designed to match the characteristic impedance. Thus, as shown, the anti-pad layouts for via pairs 422 and 446, 424 and 444, and 426 and 442 are depicted as being very closely spaced apart.

It will be understood that the routing of vias and the placements of via anti-pads can result in crowded signal trace routings and via placements. Further, the associated via anti-pads, being uniformly large in comparison with the actual sizes and spacings of the traces and vias, contribute to densely populated conducting layers, and the routing of high-speed serial interfaces between devices becomes increasingly challenging. Further, the densely packed via anti-pads may also impact AC and DC power distribution due to the decreased current-carrying locations between the anti-pads, that is, in the small regions where the metal of the conducting layers remains intact between the via anti-pads. In particular, where the density of signal traces is increased to a point where the current carrying capacity of the conducting layers is constrained, a designer is faced with the expensive option of increasing the layer count in the PCB of a given design.

Figure 5:
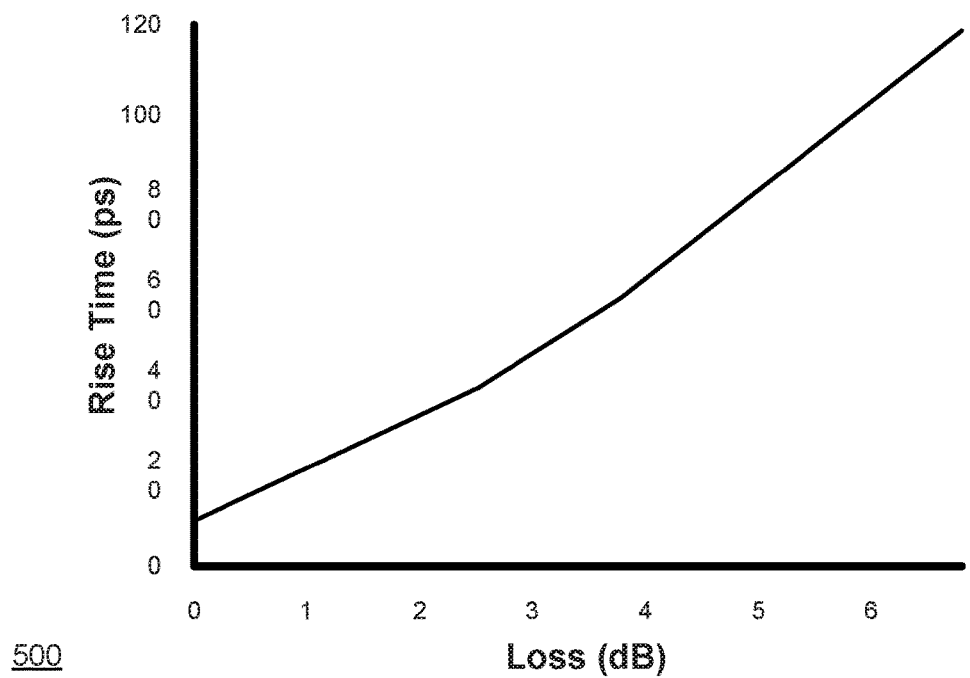
FIG. 5 is a graph illustrating a relationship between loss in a high-speed serial interface channel versus the rise time of a signal transmitted on the channel.

FIG. 5 is a graph illustrating a relationship between loss in a high-speed serial interface channel versus the rise time of a signal transmitted on the channel. It is noted that in the current generation of high-speed serial interfaces, a signal transition rise time is on the order of ten (10) picoseconds (ps), as viewed from a transmitter. That is, the time when a signal transition from a first state to a second state is initiated to the time that signal levels have stabilized at the second state is assumed herein to be on the order of 10 ps. It is further assumed for the purposes of the illustrated embodiment, that the driving impedance of the transmitter is 100 ohms. It will be understood that other rise times and driving impedances may be utilized in the context of the present embodiments, and that the skilled artisan will understand that the details of implementing the present embodiments for different channel characteristics will be understood based upon the teachings of the present embodiments. It is further noted that, due to channel resistance, parasitic capacitance, and inductance of the traces, vias, connections, and the like, as a signal transits through a channel, the channel induces an accumulated loss to the transiting signals. The graph illustrates the accumulated loss on the x-axis, which can be roughly correlated to a distance from the transmitter.

The inventors of the present disclosure have noted that, with an increase in the accumulated loss, the signal transition rise time of a signal increases. That is, at any given point along a channel, the perceived rise time of a signal transition increases the further away from the transmitter that the rise time is measured. Thus the graph illustrates the perceived rise time of a signal transition on the y-axis. For example, at zero (0) loss, that is, at the transmitter, the rise time of the signal is not degraded, but is seen to be 10 ps. However, at a location of the channel where the channel has induced 1 dB of loss to the signal, the perceived rise time of the signal is approximately 20 ps, and at a location of the channel where the channel has induced 6 dB of loss to the signal, the perceived rise time of the signal is approximately 100 ps. In a particular embodiment, the relationship between the accumulated loss and the rise time may be approximated as a straight line based upon calculations or measurements of the rise time of a particular transmitter at the source and at the destination. In another embodiment, the relationship may be determined based upon calculations or measurements of the rise time at various points in a channel, such as at via locations, connector pads, decoupling capacitors, or the like, and the curve can be fit from the data at the various locations. It will be understood that non-linearities in the data may be ascribed to real-world effects, while the linear approximation may be based upon theoretical considerations.

Figure 6:
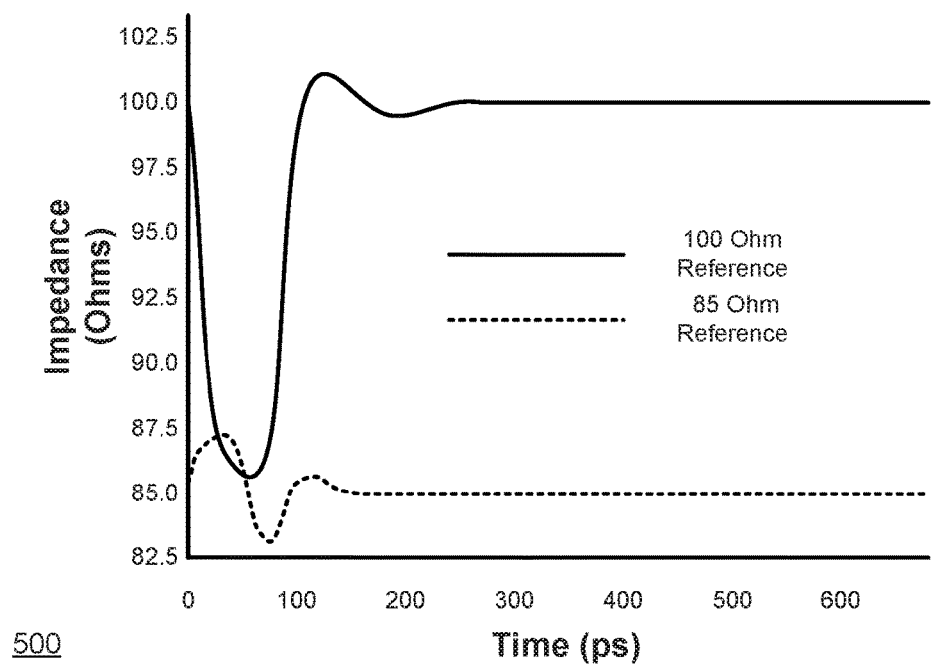
FIG. 6 is a graph illustrating a TDR plot of a 100 ps rise time signal as provided to a 100 ohm reference via, and as provided to a 85 ohm reference via.

The inventors of the present disclosure have further noted that as the rise time of a signal transmitted on a channel degrades with the accumulated loss, the optimum impedance for discontinuities in the channel decreases. For example, FIG. 6 is a graph illustrating a TDR plot of a 100 ps rise time signal as provided to a 100 ohm reference via in the solid line, and as provided to a 85 ohm reference via in the dotted line. Note that the reflection of the 100 ps rise time signal as provided to the 100 ohm reference via is much greater than the reflection of the 100 ps rise time signal as provided to the 85 ohm reference via. It will be understood that, by providing a variety of rise time signals (e.g., rise times of various durations between 10 ps and 150 ps) into reference vias with a variety of reference impedance vias (e.g., vias on a test PCB of various impedances between 70 ohms and 100 ohms for a 100 ohm transmitter), and by measuring a TDR response of the variety of rise time signals to the variety of reference impedance vias, an optimum via impedance level for a particular rise time signal can be determined based upon the magnitude of the reflections. For each rise time signal, the optimum via impedance level can be determined as the reference via that demonstrated the lowest magnitude of reflection. In this way, a reference table for designing vias can be provided. Table 1, below provides an example of the optimum via impedances for various rise time signals. Thus, by designing via impedance based upon the perceived rise time at the via location, the signal integrity of the signal as received at the receiver is improved because the reflections at each via are minimized based upon the perceived rise time. Further, because lower impedance vias necessitate smaller via anti-pads, the use of via impedances that are matched to the perceived rise time at the via location further provide greater amounts of conducting material in the conducting layers of the PCB, and thus the AC and DC performance of the power system is also improved.

TABLE 1

Via Impedances

| Rise Time (ps) | Via Impedance (Ohms) |
|---|---|
| 10 | 100 |
| 20 | 97 |
| 30 | 94 |
| 40 | 91 |
| 50 | 88 |
| 60 | 85 |
| 70 | 82 |
| 80 | 79 |
| 90 | 76 |
| 100 | 73 |

Figure 7:
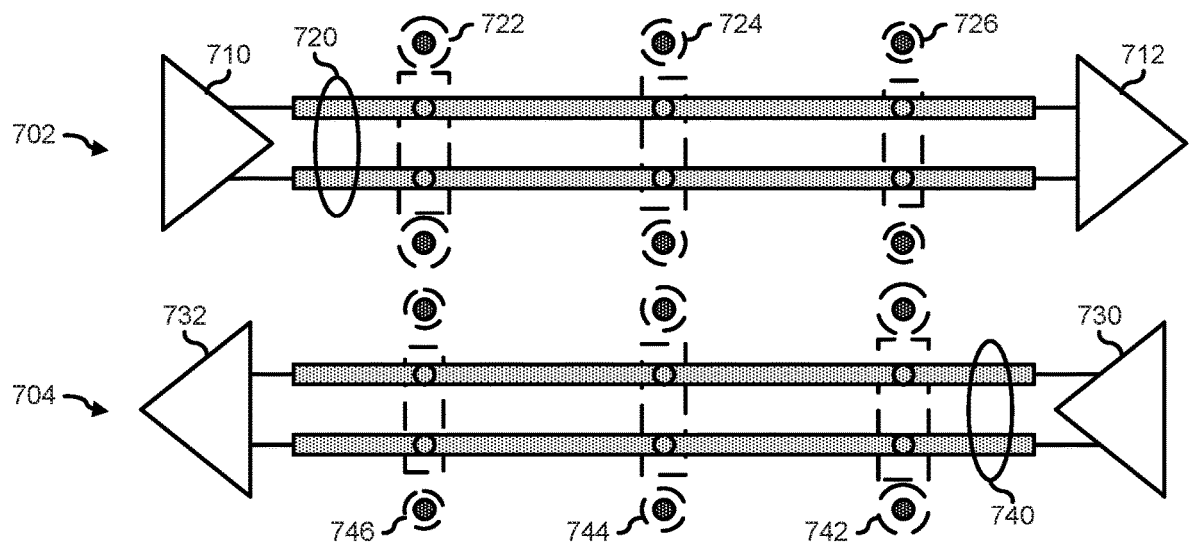
FIG. 7 is a diagram of a high-speed serial interface according to an embodiment of the present disclosure.

FIG. 7 illustrates a high-speed serial interface 700 in accordance with an embodiment of the present disclosure. High-speed serial interface 700 includes a transmit channel 702 and a receive channel 704. Transmit channel 702 includes a transmitter 710 in a first device (not illustrated) and a receiver 712 in a second device (not illustrated). Transmitter 710 represents a differential signal transmitter that provides a balanced signal to a trace 720 to receiver 712. Trace 720 includes vias 722, 724, and 726. Receive channel 704 includes a transmitter 730 in the second device and a receiver 732 in the first device. Transmitter 730 represents a differential signal transmitter that provides a balanced signal to a trace 740 to receiver 732. Trace 740 includes vias 742, 744, and 746.

Transmitters 710 and 730 are configured to drive signals onto respective traces 720 and 740 at a common driving impedance. For example, a transmitter may be configured to drive signals onto a trace with a driving impedance of 70 ohms, 75 ohms, 80 ohms, 85 ohm, 90 ohms, 100 ohms, or another driving impedance, as needed or desired. Similarly, receivers 712 and 732 are configured to receive signals from a trace with a receiving impedance that is the same as the driving impedance of the associated transmitter. Here, however, in contrast with high-speed serial interface 400, vias 722, 724, 726, 742, 744, and 746 are not designed to match the characteristic impedance of transmitters 710 and 730, but are designed based upon the perceived signal rise time at the location of the vias. In particular, the anti-pad for via 722, that is, the via closest to respective transmitter 710, is larger than the anti-pads for vias 724 and 726 in order to create a higher impedance via design for via 722. Similarly, the anti-pad for via 724, that is, the via that is midway between transmitter 710 and receiver 712, is of an intermediate size in order to create a medium impedance via design for via 724. Finally, the anti-pad for via 726, that is, the via that is furthest from transmitter 710, is of a smaller size than vias 722 and 724 in order to create a low impedance via design for via 726. Vias 742, 744, and 746 are also designed based upon the perceived signal rise time at the location of the vias.

In this way, the signal integrity improved due to the decreased reflection of the signals at the vias. Further, because the lower impedance vias necessitate smaller via anti-pads, the use of via impedances that are matched to the perceived rise time at the via location further provide greater amounts of conducting material in the conducting layers of the PCB, as can be seen by the increase distance between the anti-pads of vias 722 and 746, vias 724 and 744, and vias 726 and 742. In this way, the AC and DC performance of the power system of the PCB is also improved. Finally, because the density of the anti-pads is decreased, the need for additional layers in the PCB is reduced.

Figure 8:
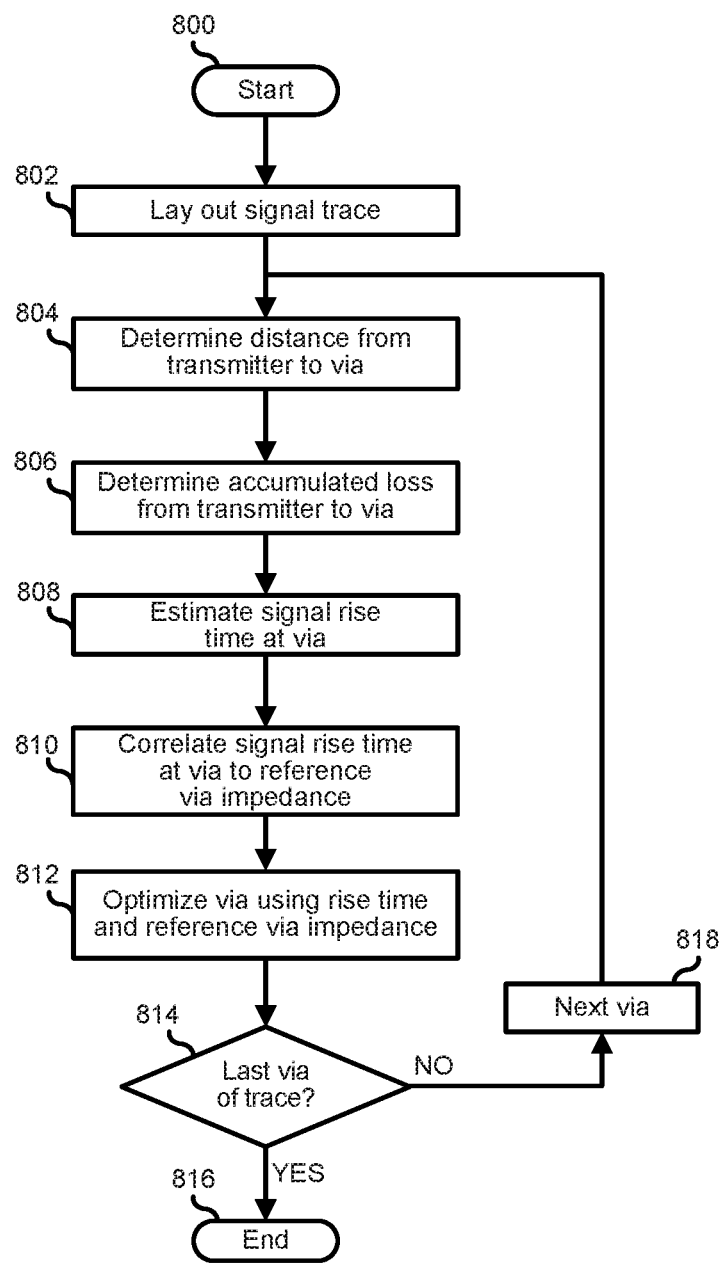
FIG. 8 is a flowchart illustrating a method for via optimization in a PCB according to an embodiment of the present disclosure.

FIG. 8 illustrates a method for via optimization in a PCB starting at block 800. A signal trace between a transmitter in a first component of a system and a receiver in a second component of the system is laid out on a PCB in block 802. The signal trace may represent a differential signal trace pair of a high-speed serial interface, or may represent a single trace of a single-ended signal interface. A distance of a first via of the signal trace from the transmitter is determined in block 804, and the accumulated loss of the signal trace to the location of the via is determined in block 806. In a particular embodiment, the accumulated loss is determined based upon an analysis of the signal trace. In another embodiment, the accumulated loss is determined based upon a lookup table of accumulated loss versus signal trace length. Here, the table can be populated based upon analysis of signal traces, or upon measured values, such as those depicted in FIG. 5.

The signal rise time at the via is estimated at block 808. Here, the estimated signal rise time at the via will depend upon the rise time of the transmitter, the transmitter impedance, the signal trace impedance, and other circuit related factors such as the physical layout and design rules of traces on the PCB. The estimated signal rise time is correlated to an optimum via impedance in block 810. In a particular embodiment, the estimated signal rise time may be correlated with the optimum via impedance based upon an analysis of the via structure. In another embodiment, the estimated signal rise time may be correlated with the optimum via impedance based upon a look table similar to Table 1. Here the table can be populated based upon analysis of via structures, or upon measured values, such as those depicted in FIG. 6.

The via design is optimized to the match the via impedance identified by the correlation of the estimated signal rise time to the optimum via impedance in block 812, and a decision is made as to whether or not the via is the last via in the signal trace in decision block 814. If not, the "NO" branch of decision block 814 is taken, the next via is selected in block 818, and the method returns to block 804 where a distance of the next via of the signal trace from the transmitter is determined. If the via is the last via in the signal trace, the "YES" branch of decision block 814 is taken, and the method ends in block 816.

It will be noted that impedances should be measured at an expected operating frequency of the data communication interface associated with the particular signal trace. Note that, while the examples illustrated herein relate to differential signal pairs of high-speed serial interfaces, the teachings herein may similarly be applied to single-ended signal traces.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

In this disclosure, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

What is claimed is:

1. A signal trace on a printed circuit board (PCB), the signal trace comprising:
    a first trace segment on a first layer of the PCB, the first trace segment having a first end coupled to a transmitter, having a second end, and having a first characteristic impedance that is matched to the transmitter; and
    a first signal via passing from the first layer of the PCB to a second layer of the PCB, the first signal via having a first contact connected to the second end of the first trace segment, having a second contact on the second layer, and having a second characteristic impedance different from the first characteristic impedance, wherein the second characteristic impedance is determined based upon a first distance between the transmitter and the first via.

2. The signal trace of claim 1, wherein in determining the second characteristic impedance, the first distance is correlated to an accumulated loss in the signal trace from the transmitter to the first via.

3. The signal trace of claim 2, wherein correlating the first distance to the accumulated loss, the accumulated loss is correlated to an increase in a rise time of a signal transmitted via the signal trace as perceived at the first via.

4. The signal trace of claim 3, wherein determining the second characteristic impedance is based upon the accumulated loss and the rise time.

5. The signal trace of claim 1, further comprising:
    a second trace segment on the second layer, the second trace segment having a first end connected to the second contact of the first signal via and having a second end; and
    a second signal via passing from the second layer of the PCB to a third layer of the PCB, the second signal via having a first contact connected to the second end of the second trace segment, having a second contact on the third layer, and having a third characteristic impedance different from the first and second characteristic impedances, wherein the second characteristic impedance is determined based upon a second distance from the transmitter to the second via.

6. The signal trace of claim 5, wherein the first characteristic impedance is greater than the second characteristic impedance and the second characteristic impedance is greater than the third characteristic impedance.

7. The signal trace of claim 6, wherein a design of the first via includes a first anti-pad configuration associated with the second characteristic impedance, a design of the second via includes a second anti-pad configuration associated with the third characteristic impedance, and the first anti-pad configuration is larger than the second anti-pad configuration.

8. A method for laying out a signal trace on a printed circuit board (PCB), the method comprising:
    laying out a first trace segment on a first layer of the PCB, the first trace segment having a first end coupled to a transmitter, having a second end, and having a first characteristic impedance that is matched to the transmitter;
    laying out a first signal via passing from the first layer of the PCB to a second layer of the PCB, the first signal via having a first contact connected to the second end of the first trace segment, having a second contact on the second layer, and having a second characteristic impedance different from the first characteristic impedance; and
    determining the second characteristic impedance based upon a first distance between the transmitter and the first via.

9. The method of claim 8, wherein in determining the second characteristic impedance, the method further comprises:
    correlating the first distance to an accumulated loss in the signal trace from the transmitter to the first via.

10. The method of claim 9, wherein in correlating the first distance to the accumulated loss, the method further comprises:
    correlating the accumulated loss to an increase in a rise time of a signal transmitted via the signal trace as perceived at the first via.

11. The method of claim 10, wherein determining the second characteristic impedance is based upon the accumulated loss and the rise time.

12. The method of claim 8, further comprising:
laying out a second trace segment on the second layer, the second trace segment having a first end connected to the second contact of the first signal via, having a second end, and having a third characteristic impedance different from the first and second characteristic impedances; and
laying out a second signal via passing from the second layer of the PCB to a third layer of the PCB, the second signal via having a first contact connected to the second end of the second trace segment, having a second contact on the third layer, and having a third characteristic impedance; and
determining the third characteristic impedance based upon a second distance from the transmitter to the second via.

13. The method of claim 12, wherein the first characteristic impedance is greater than the second characteristic impedance and the second characteristic impedance is greater than the third characteristic impedance.

14. The method of claim 13, wherein a design of the first via includes a first anti-pad configuration associated with the second characteristic impedance, a design of the second via includes a second anti-pad configuration associated with the third characteristic impedance, and the first anti-pad configuration is larger than the second anti-pad configuration.

15. An information handling system, comprising:
a first component including a transmitter;
a second component including a receiver; and
signal trace configured to connect the transmitter to the receiver, the signal trace including:
a first trace segment on a first layer of the PCB, the first trace segment having a first end coupled to the transmitter, having a second end, and having a first characteristic impedance that is matched to the transmitter; and
a first signal via passing from the first layer of the PCB to a second layer of the PCB, the first signal via having a first contact connected to the second end of the first trace segment, having a second contact on the second layer, and having a second characteristic impedance different from the first characteristic impedance, wherein the second characteristic impedance is determined based upon a first distance between the transmitter and the first via.

16. The information handling system of claim 15, wherein in determining the second characteristic impedance, the first distance is correlated to an accumulated loss in the signal trace from the transmitter to the first via.

17. The information handling system of claim 16, wherein correlating the first distance to the accumulated loss, the accumulated loss is correlated to an increase in a rise time of a signal transmitted via the signal trace as perceived at the first via.

18. The information handling system of claim 17, wherein determining the second characteristic impedance is based upon the accumulated loss and the rise time.

19. The information handling system of claim 15, the signal trace further comprising:
a second trace segment on the second layer, the second trace segment having a first end connected to the second contact of the first signal via and having a second end; and
a second signal via passing from the second layer of the PCB to a third layer of the PCB, the second signal via having a first contact connected to the second end of the second trace segment, having a second contact on the third layer, and having a third characteristic impedance different from the first and second characteristic impedances, wherein the second characteristic impedance is determined based upon a second distance from the transmitter to the second via.

20. The information handling system of claim 19, wherein the first characteristic impedance is greater than the second characteristic impedance and the second characteristic impedance is greater than the third characteristic impedance.

* * * * *